United States Patent [19]

Shiga

[11] Patent Number: 5,206,607
[45] Date of Patent: Apr. 27, 1993

[54] INPUT MATCHING CIRCUIT

[75] Inventor: Nobuo Shiga, Yokohama, Japan

[73] Assignee: Sumitomo Electric Industries, Ltd., Osaka, Japan

[21] Appl. No.: 677,433

[22] Filed: Mar. 29, 1991

[30] Foreign Application Priority Data

Apr. 13, 1990 [JP] Japan .................................. 2-98381

[51] Int. Cl.$^5$ ............................................. H03F 3/60
[52] U.S. Cl. ........................................ 330/286; 333/33
[58] Field of Search ................. 330/53, 277, 286, 302, 330/305; 333/32, 33; 343/700 MS File

[56] References Cited

U.S. PATENT DOCUMENTS

| 3,940,706 | 2/1976 | Stegens | 330/286 |
| 4,803,446 | 2/1989 | Watanabe et al. | 333/26 |
| 5,010,305 | 4/1991 | Shiga | 330/277 |

OTHER PUBLICATIONS

Krauss, et al., "Solid State Radio Engineering," pp. 26-33, 1980.
Bharj, "17 GHz Low Noise GaAs FET Amplifier," Microwave Journal, pp. 121-126, vol. 27, No. 10, Oct. 1984.

*Primary Examiner*—Steven Mottola
*Attorney, Agent, or Firm*—Stevens, Davis, Miller & Mosher

[57] ABSTRACT

In an input matching circuit adapted to be connected to an input circuit of a low noise amplifier, a matching point of impedance conversion is set to a point shifted from a mean value of variations of an optimum signal source impedance of the low noise amplifier so that a change of noise index is gentle even if the optimum signal source impedance of the low noise amplifier includes variations.

3 Claims, 7 Drawing Sheets

INPUT MATCHING CIRCUIT

BACKGROUND OF THE INVENTION

1. Field of the Invention

The present invention relates to an input matching circuit connected to an input circuit of a low noise amplifier which is used in a converter for direct broadcast satellite (DBS) systems.

1. Related Background art

A noise figure (NF) of an amplifier which uses a field effect transistor (FET) varies with a signal source impedance viewed from the FET toward a signal source, and it is minimum at a certain signal source impedance ($Z_{opt}$). Thus, an input matching circuit is provided in the signal source of the FET so that the signal source impedance viewed from the FET assumes an optimum signal source impedance $Z_{opt}$.

However, the optimum signal source impedance $Z_{opt}$ varies with variations in the manufacture of the FET. A prior art input matching circuit of the low noise amplifier has been designed such that the signal source impedance viewed from the FET is a mean value of the variations of the optimum signal source impedance $Z_{opt}$.

However, a constant noise contour on a Smith chart for an FET is not symmetric to the optimum signal source impedance $Z_{opt}$ but rather is offset therefrom. As a result, even if an external impedance (50Ω) is converted to the mean value of the optimum signal source impedance $Z_{opt}$, a mean value of variations of the NF of the amplifier is not necessarily minimum due to the offset of the constant noise contour.

SUMMARY OF THE INVENTION

It is an object of the invention to resolve the above problem. In accordance with the present invention, the input matching circuit adapted to be connected to an input circuit of an amplifier is characterized in that a line connecting a point of a Smith chart indicating a means value of variations of an optimum signal source impedance due to manufacturing variations of the amplifier and a center point of the Smith chart is drawn, two points on the line which are spaced from the mean value point by predetermined multiples of a standard deviation of variations of said optimum signal source impedance are determined, a crosspoint of those constant noise contours in two groups of constant noise contours respectively having the two points as the optimum signal source impedances and imparting the same noise figure on the line is determine, and the signal source impedance, as viewed from said low noise amplifier, is designed to have the impedance indicated by said crosspoint. The matching point thus determined is located such that an interval between the constant noise contour is larger than that where the mean value of the variations of the optimum signal source impedance f the amplifier to be connected is used as the matching point. Accordingly, even if the optimum signal source impedance varies, the change of the noise index is gentle and the mean value of the manufacturing variations of the NF of the low noise amplifier is smaller.

The present invention will be more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 67 shows a prior art amplifier.

DETAILED DESCRIPTION OF THE PREFERRED EMBODIMENTS

In general, the NF (hereinafter F) of the FET is represented by $$F = F_{min} + \frac{(4R_n|\Gamma_s - \Gamma_{opt}|^2)}{\{(1-|\Gamma_s|^2)|1+\Gamma_{opt}|^2\}}$$

where
$F_{min}$ is a minimum value of NF,
$R_n$ is equivalent noise resistance
$\Gamma_s$ is a signal source power reflection coefficient
$\Gamma_{opt}$ is optimum signal source power reflection coefficient which minimizes NF $\Gamma_{opt}$ and $Z_{opt}$ have a relationship of $$\Gamma_{opt} = \frac{Z_{opt} - 50}{Z_{opt} + 50}.$$

$\Gamma_{opt}$ and $Z_{opt}$ indicate the same point on a Smith chart.

Figure 2:
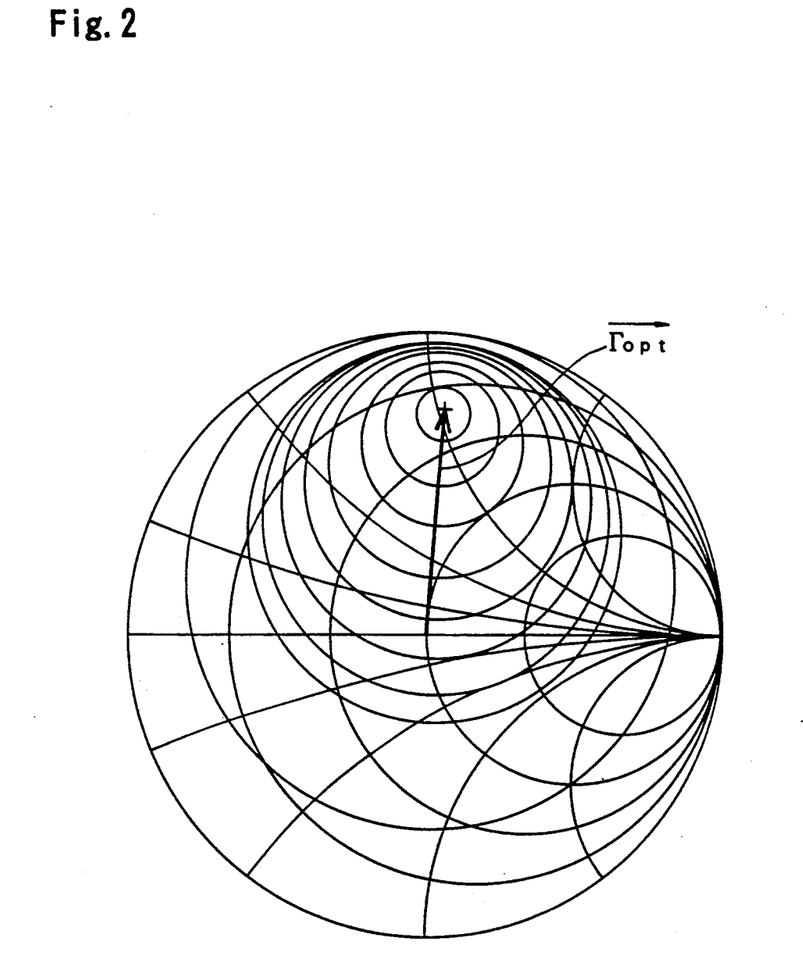
FIG. 2 shows a Smith chart for illustrating a locus of constant noise figures.

There are an infinite number for combinations as signal source power reflection coefficient $\Gamma_s$ in which F (excluding $F_{min}$) assumes a constant value, and a locus thereof is a circle on a Smith chart shown in FIG. 2. This circle is called a constant noise contour, and a center ($C_{Fi}$ and a radius $R_{Fi}$ of the constant noise contour for a noise index $F_i$ are given by $$C_{Fi} = \Gamma_{opt}/(1+N_i)$$

$$R_{Fi} = \{1/(1+N_i)\}\cdot\{N_i^2 + N_i(1-|\Gamma_{opt}|^2)\}^{\frac{1}{2}}$$

where $N_i = \{(F_i - F_{min})/4R_n\}\cdot|1+\Gamma_{opt}|^2$.

Figure 3:
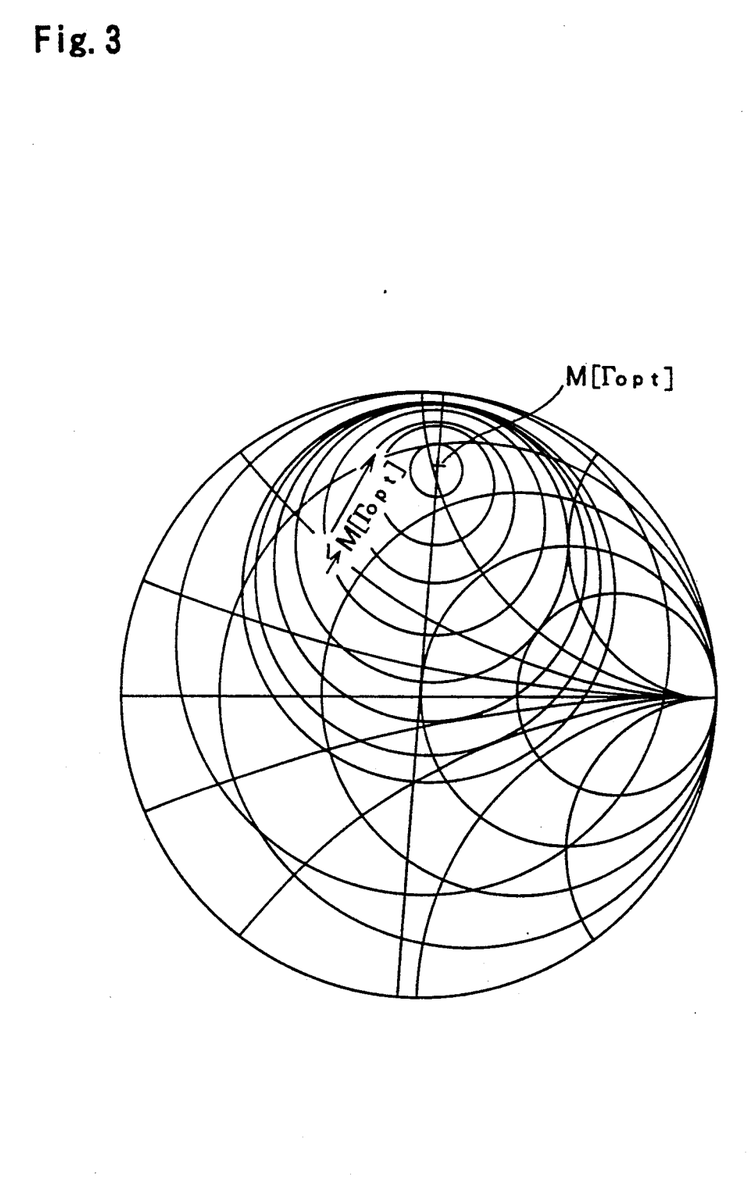
FIG. 3 shows a Smith chart for explaining the magnitude of intervals of constant noise contours.

As seen from the above equation, the center $C_{Fi}$ of the constant noise contour is on the vector $\Gamma_{opt}$ and the respective circles are not concentric. As a result, the interval of the constant noise contour is smallest toward the vector $\Gamma_{opt}$ starting from $\gamma_{opt}$, and largest toward the vector $-\Gamma_{opt}$. The mean value of variations of $\Gamma_{opt}$ is represented by $M\{\Gamma_{opt}\}$ as shown in FIG. 3. The variation when $\Gamma_{opt}$ changes toward the vector $M\{\Gamma_{opt}\}$ relative to M{Γ$_{opt}$} and the variation when Γ$_{opt}$ changes toward the vector −M{Γ$_{opt}$} are equal in distance, but the change in the NF is largest when Γ$_{opt}$ changes toward the vector M{Γ$_{opt}$} because the interval of the constant noise contours increases to the largest along the vector M{Γ$_{opt}$}. On the other hand, when Γ$_{opt}$ changes toward the vector −M}Γ$_{opt}$}, the interval of the constant noise contours changes to the smallest along the vector so that the change in the N$_F$ is small, which is a desirable condition.

Accordingly, if the input matching circuit is matched not to M{Γ$_{opt}$} but to a point slightly shifted from M{Γ$_{opt}$} toward the vector −M{Γ$_{opt}$}, the mean value of the manufacturing variations of the NF of the low noise amplifier can be reduced. For example, it is assumed that the input matching circuit is matched to a point Γ$_Q$ shown in FIG. 4. M$^+${Γ$_{opt}$} represents a point assumed when Γ$_{opt}$ is shifted from M{Γ$_{opt}$} by a predetermined amount toward the vector M{Γ$_{opt}$}, and M$^−${Γ$_{opt}$} represents a point assumed when Γ$_{opt}$ is shifted rom M{Γ$_{opt}$} by the same amount toward the vector −M{Γ$_{opt}$}. Three constant noise contours are drawn for each of the points M$^+${Γ$_{opt}$} and M$^−${Γ$_{opt}$}. The circles correspond to F$_{min}$+1dB, F$_{min}$+2dB and F$_{min}$+3dB.

Figure 4:
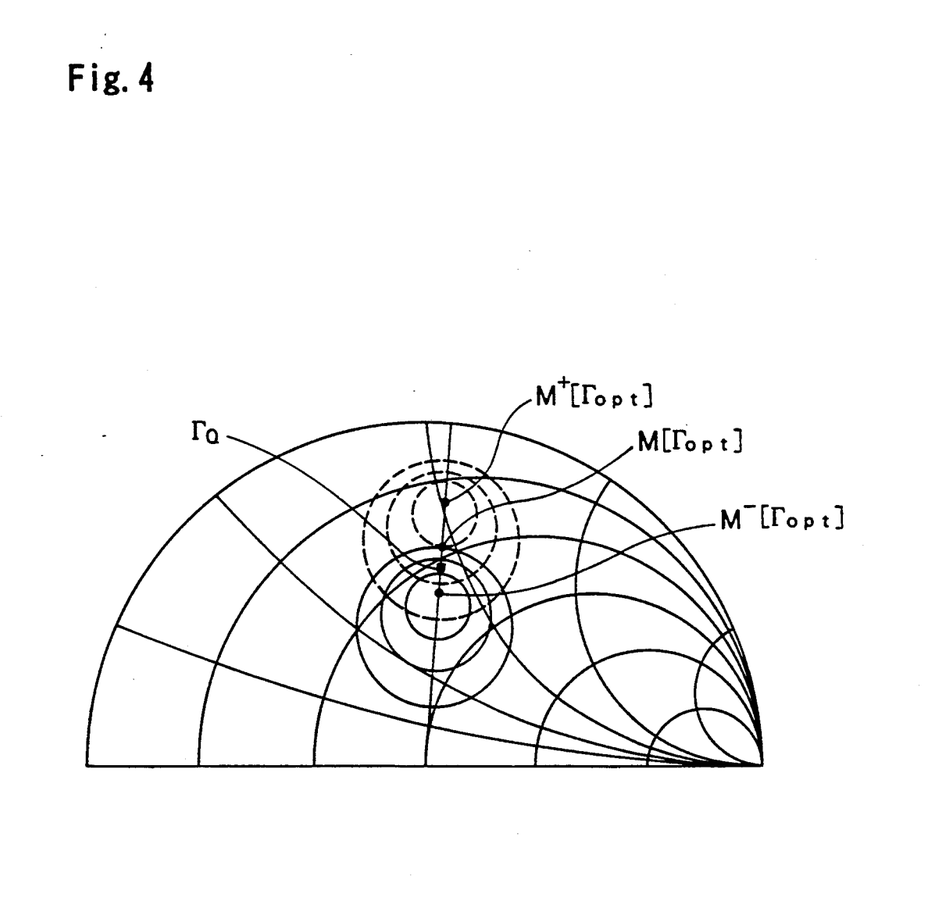
FIG. 4 shows a Smith chart for explaining a difference between variations of noise indices due to differences in positions of matching points for impedance conversion.

If the input matching circuit of the amplifier is designed to match to M{Γ$_{opt}$}, the NF of the amplifier is deteriorated by 1dB when Γ$_{opt}$ is fitted to M$^+${Γ$_{opt}$}, and deteriorated by 3dB when Γ$_{opt}$ is shifted to M$^−${Γ$_{opt}$}. The amounts of shift of Γ$_{opt}$ in the respective directions are equal and represented by $$|M^+\{\Gamma_{opt}\}-M\{\Gamma_{opt}\}|-|M^-\{\Gamma_{opt}\}-M\{\Gamma_{opt}\}|.$$

However, although the amounts of shift are equal, the agree of deterioration of the NF differs depending on the direction of shift of Γ$_{opt}$.

On the other hand, if the input matching circuit of the amplifier is designed to match to the point Γ$_Q$ shown in FIG. 3, the NF of the amplifier is F$_{min}$+1.5dB when Γ$_{opt}$ of the FET is shifted to either M$^+${Γ$_{opt}$} or M$^−${Γ$_{opt}$}, and the mean value of the manufacturing variations of the NF of the amplifier is reduced. A statistical property of the manufacturing variations of Γ$_{opt}$ greatly depends on a device structure, a device size and a manufacturing process, and an optimum value of Γ$_Q$ cannot be generally defined.

However, as for the constant noise contour when Γ$_{opt}$=M$^+${Γ$_{opt}$} and the constant noise contours when Γ$_{opt}$=M$^−${Γ$_{opt}$}, there is one NF value at which the constant noise contours which impart the same NF value cross a line connecting M{Γ$_{opt}$} and a center of a Smith chart. In the above example, that value is F$_{min}$+1.5dB. Thus it is optimum to set Γ$_Q$ around the crosspoint in order to minimize the mean value of the variations of the NF. However, to determine the ranges of M$^+${Γ$_{opt}$} and M$^−${Γ$_{opt}$} relative to the variations of Γ$_{opt}$, statistical data of the manufacturing variations of Γ$_{opt}$ is needed. In general, it may be set to ±σ ±3σ (when σ is a standard deviation of manufacture variations of Γ$_{opt}$).

The above discussion is explained by specific examples.

It is assumed that the mean value M{Γ$_{opt}$} of the manufacturing variations of Γ$_{opt}$ is (0.7, 100°), that is, $$|M\{\Gamma_{opt}\}|=0.7$$

$$\text{angle } M\{\Gamma_{opt}\}=100°$$

and the standard deviation σ of |Γ$_{opt}$} is 0.05. |M{Γ$_{opt}$}| represents the mean value of variations of the absolute value of Γ$_{opt}$, and angle M{Γ$_{opt}$} represents the mean value of variations of phase angle of Γ$_{opt}$. In accordance with the above discussion, M$^+${Γ$_{opt}$} and M$^−${Γ$_{opt}$} are set as follows:

$$M^+\{\Gamma_{opt}\}=(0.8, 100°)$$

$$M^-\{\Gamma^{opt}\}=(0.6, 100°).$$

The distances from m$^+${Γ$_{opt}$} and M$^−${Γ$_{opt}$} to M{Γ$_{opt}$} are ±2σ. then, the constant noise contours are drawn for Γ$_{opt}$=M$^+${Γ$_{opt}$} and Γ$_{opt}$=M$^−${Γ$_{opt}$}.

Figure 1:
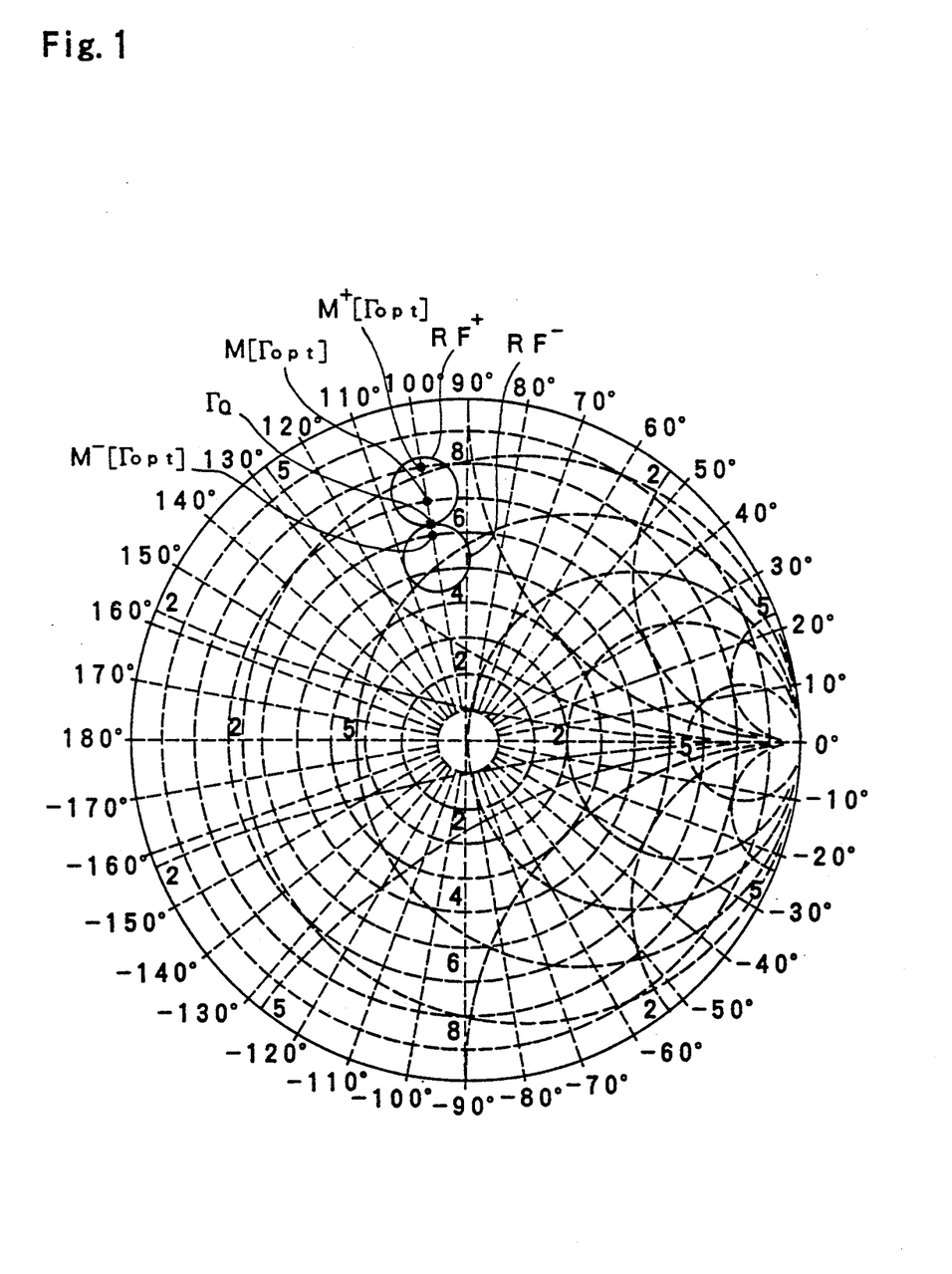
FIG. 1 shows a Smith chart for illustrating setting of a matching point in a low noise amplifier in one embodiment of the present invention.

If the circle RF$^+$ for F$_{min}$ +a(dB) of the constant noise contours for Γ$_{opt}$=M$^+${Γ$_{opt}$}, and the circle R$_F^−$ for F$_{min}$+a(dB) of the constant noise contours for Γ$_{opt}$=M$^−${Γ$_{opt}$} cross on the line connecting M{Γ$_{opt}$} and he center of the Smith chart shown in FIG. 1, the crosspoint may be used as Γ$_Q$ in designing the input matching circuit f the amplifier. Namely, the input matching circuit si designed to convert the impedance from 50Ω to Γ$_Q$.

Figure 5:
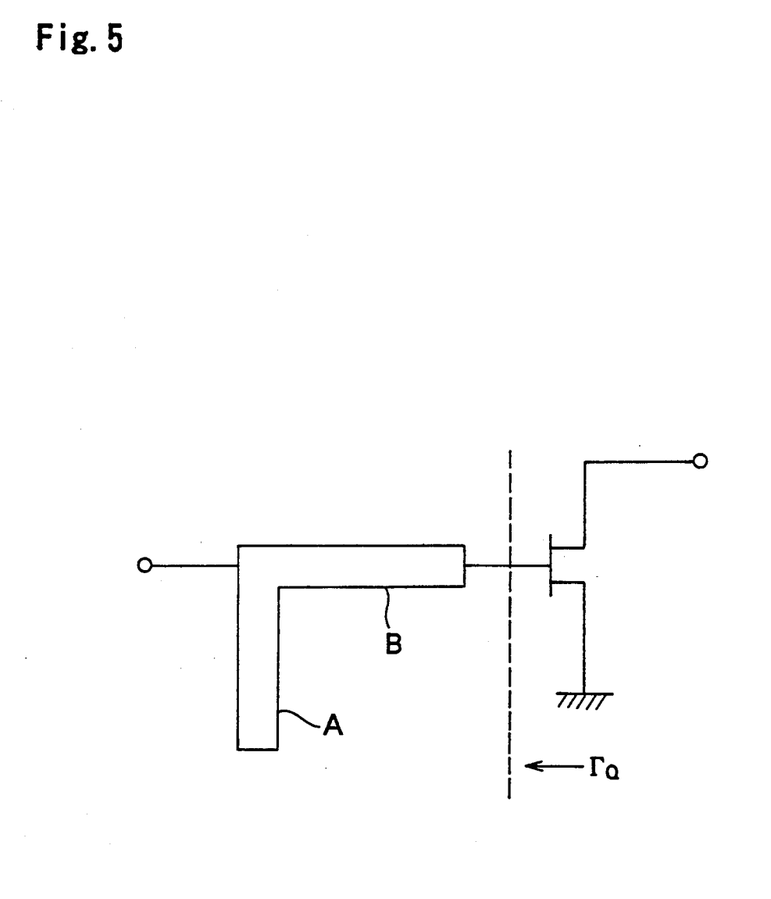
FIG. 5 shows a configuration of amplifier of the above embodiment.
Figure 6:
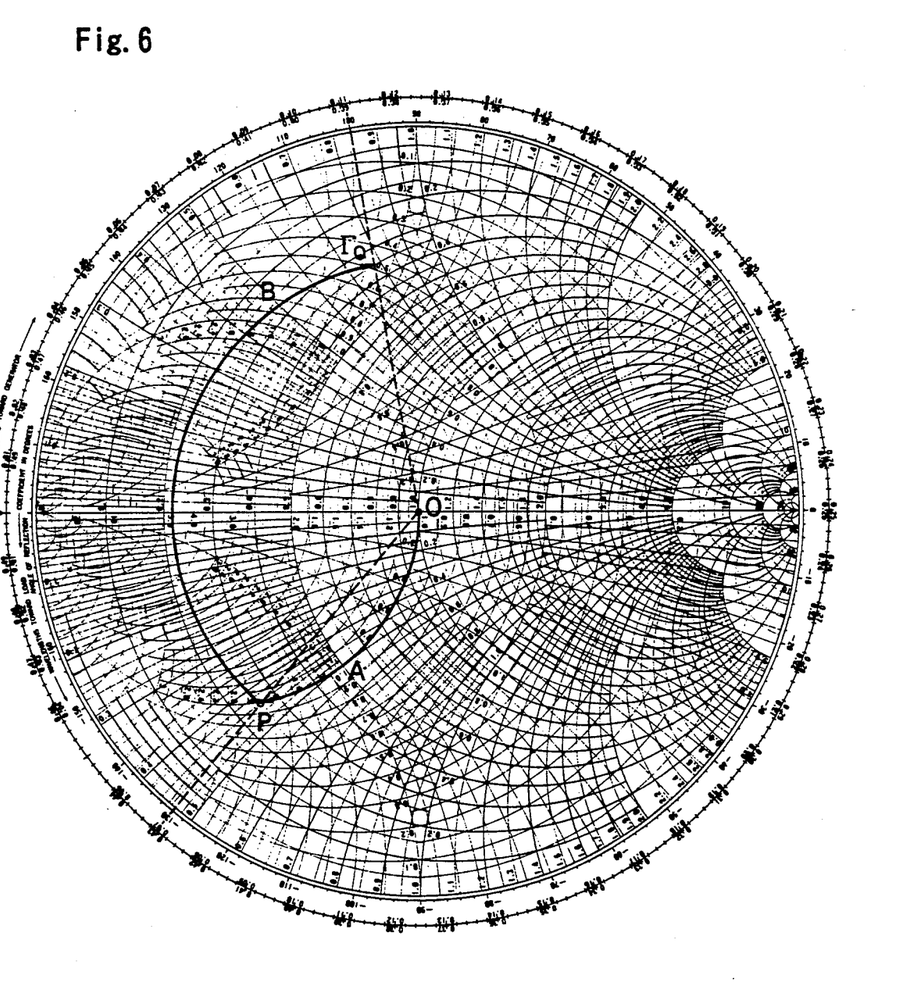
FIG. 6 shows a Smith chart for examining a shift status of the matching point in the amplifier shown in FIG. 5.
Figure 7:
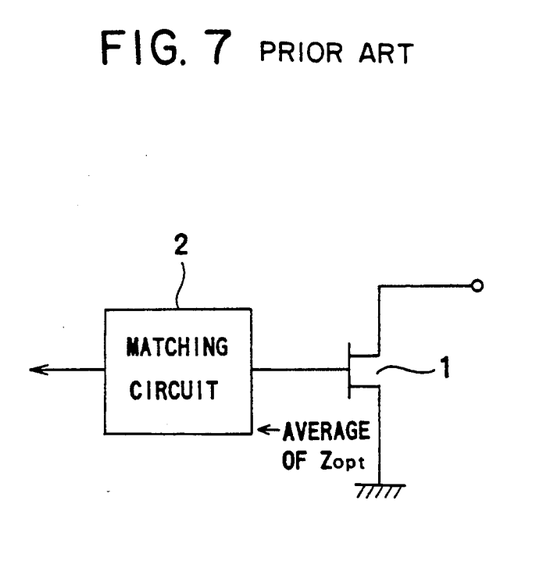

Such an input matching circuit is shown in FIG. 5, which may be implemented by an open stub A and a microstrip line B. This is explained with reference to an immittance chat shown in FIG. 6. Both the open stub A and the microstrip line B are formed by microstrip lines having a characteristic impedance of 50Ω. The 50Ω point at the center of the Smith chart is converted to a point P by the open stub A. Since a suceptance of the point P is −1.7, an electrical length Q$_{11}$ of the open stub A may be set to:

$$A_{11}=\tan^{-1}1.7=59.5:$$

An electrical length Q$_{12}$ of the microstrip line B may be set to convert the point P to Γ$_Q$. A wavelength for the point P is 0.069 when it is read from a wavelength circle on an extended line of a line OP, where O is the center of the chart. Similarly, a wavelength for Γ$_Q$ is 0.111. Accordingly, the electrical length Q$_{12}$ of the microstrip line B is given by:

$$Q_{12}=360° \times (0.111+0.069)=64.8°.$$

Accordingly, the open stub A in the input matching circuit may be designed to have the characteristic impedance of 50Ω and the electrical length Q$_{11}$ of 59.5°, and the microstrip line B may be designed to have the characteristic impedance of 50Ω and the electrical length Q$_{12}$ of 64.8°.

In the past, an input matching circuit was designed such that the input matching circuit matched to the mean value of the manufacture variations of Γ$_{opt}$. Namely, the input matching circuit was matched to M{Γ$_{opt}$} on the smith chart of FIG. 4. However, since the constant noise contours are not concentric as described above, such design does not necessarily minimize the mean value of the variations of the NF of the amplifier caused by the variations of Γ$_{opt}$, because the intervals of the constant noise contours are not uniform. In the low noise amplifier which uses the input matching circuit of the present invention, the matching point is shifted toward a larger intervals of the constant noise contours so that the mean value of variations of the NF of the amplifier caused by the variations of $\Gamma_{opt}$ is minimized.

From the invention thus described it will be obvious that the invention may be varied in many ways. such variations are not to be regarded as a departure from the spirit and scope of the invention, and all such modifications as would be obvious to one skilled in the art are intended to be included within the scope of the following claims.

I claim:

1. A method for constructing an input matching circuit adapted to be connected to an input circuit of an amplifier, comprising the steps of:
    (a) drawing a line on a Smith chart, said lien connecting a first point and a second point, said fist point being on the Smith chart and indicating a man value of variations of an optimum signal source impedance due to manufacturing variations of the amplifier and said second point being positioned at a center of the Smith chart;
    (b) determining a third point and a fourth point on said line drawn in step (a), said third point and said fourth point being spaced from said mean value by predetermined multiples of a standard deviation of variations of said optimum signal source impedance;
    (c) obtaining a crosspoint and equi-noise index circles crossing said line drawn in step (a) at said crosspoint, said equi-noise index circles being circles of a group which respectively have said cited point and said fourth point as the optimum signal source impedance and imparting the aem noise index;
    (d) designing an input matching circuit wherein the signal source impedance as viewed from said low noise amplifier has the impedance indicated by said crosspoint; and
    (e) constructing an input matching circuit in accordance with the design of step (d).

2. A method according to claim 1 wherein said third point and said fourth point are selected from a range of $\pm 1$ to $\pm 3$ times the standard aviation spaced from the man value point of the variations of the optimum signal source impedance.

3. A method according to claim 1 wherein said input matching circuit comprises an open stub and a microstrip, and electrical lengths of said open stub and said microstrip are adjusted to convert impedances so that the signal source impedance as viewed from said amplifier is equal to the impedance determined on the Smith chart.

* * * * *